(12) United States Patent
Iki

(10) Patent No.: US 9,231,109 B2
(45) Date of Patent: Jan. 5, 2016

(54) ELECTRO-OPTICAL DEVICE AND ELECTRONIC APPARATUS

(75) Inventor: Takunori Iki, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 675 days.

(21) Appl. No.: 12/652,277

(22) Filed: Jan. 5, 2010

(65) Prior Publication Data

US 2010/0171131 A1    Jul. 8, 2010

(30) Foreign Application Priority Data

Jan. 5, 2009   (JP) ................. 2009-000277
Nov. 13, 2009  (JP) ................. 2009-259898

(51) Int. Cl.
  *H01L 29/205*   (2006.01)
  *H01L 29/786*   (2006.01)
  *H01L 27/12*    (2006.01)

(52) U.S. Cl.
  CPC ........ *H01L 29/78633* (2013.01); *H01L 27/124* (2013.01); *H01L 27/1255* (2013.01)

(58) Field of Classification Search
  CPC .................. H01L 29/78633; H01L 27/1214
  USPC .......... 349/139, 42–46; 257/59, 72, E33.064
  See application file for complete search history.

(56) References Cited

U.S. PATENT DOCUMENTS

| | | | |
|---|---|---|---|
| 5,185,601 A | 2/1993 | Takeda et al. | |
| 5,459,596 A | 10/1995 | Ueda et al. | |
| 5,745,195 A | 4/1998 | Zhang | |
| 5,982,460 A | 11/1999 | Zhang et al. | |
| 6,115,088 A | 9/2000 | Zhang et al. | |
| 6,313,481 B1 | 11/2001 | Ohtani et al. | |
| 6,531,713 B1 * | 3/2003 | Yamazaki | 257/59 |
| 7,242,440 B2 | 7/2007 | Kurashina et al. | |
| 7,443,456 B2 * | 10/2008 | Lai | 349/38 |
| 2004/0145541 A1 * | 7/2004 | Iki et al. | 345/44 |

FOREIGN PATENT DOCUMENTS

| | | |
|---|---|---|
| JP | 07-333651 | 12/1995 |
| JP | 07-333651 A | 12/1995 |
| JP | 10-010579 | 1/1998 |
| JP | 10-010579 A | 1/1998 |
| JP | 2001-056485 | 2/2001 |
| JP | 2001-056485 A | 2/2001 |
| JP | 2004-170914 A | 6/2004 |
| JP | 2007-003903 A | 1/2007 |

* cited by examiner

*Primary Examiner* — Laura Menz
*Assistant Examiner* — Candice Y Chan
(74) *Attorney, Agent, or Firm* — Maschoff Brennan

(57) ABSTRACT

An electro-optical device includes a first light shielding film; a transistor element formed on the first light shielding film to overlap the first light shielding film; a second light shielding film formed on the transistor element to overlap the transistor element and electrically connected to an input terminal of the transistor element; a transparent conductive film extended toward an upper layer side of the second light shielding film in an opening region, through which light penetrates, of the display region; a dielectric film formed on the transparent conductive film in the opening region; and a transparent pixel electrode formed on the dielectric film in the opening region, constituting a storage capacitor together with the transparent conductive film and the dielectric film, and having a transparent pixel electrode which is electrically connected to the transistor element.

6 Claims, 11 Drawing Sheets

ELECTRO-OPTICAL DEVICE AND ELECTRONIC APPARATUS

BACKGROUND

1. Technical Field

The present invention relates to an electro-optical device including thin film transistors which are disposed for every pixel on an element substrate as a switching element, such as a liquid crystal device, and an electronic apparatus including the electro-optical device, such as a liquid crystal projector.

2. Related Art

Such an electro-optical device includes pixel electrodes, scanning lines for selectively driving the pixel electrodes, data lines and a TFT (Thin Film Transistor) as a pixel switching element, which are provided on a substrate, to deliver the active matrix drive. In the active matrix drive, image display is implemented by supplying a scanning signal to the scanning lines to control the operation of the TFT, and simultaneously supplying the image signal to the data lines at the timing that the TFT is driven to be ON. In such an electro-optical device, a storage capacitor is provided between the TFT and a pixel electrode made of a transparent electrode such as an ITO for the purpose of enhancing contrast in the displayed image. Further, a light shielding layer may be provided for the purpose of shielding from light elements such as the pixel switching TFT installed corresponding to each pixel (e.g., see JP-A-7-333651, JP-A-10-10579 and JP-A-2001-56485).

However, when the liquid crystal device is operated, the storage capacitor sustaining the potential of the pixel electrode according to the image signal during a predetermined period is formed in a region, though which light does not penetrate, of the display region, and in a non-opening region in which various wiring such as data lines and scanning lines is provided. Therefore, there is a tradeoff in the relationship between the enlarged opening region of the plurality of pixels which constitute the display region, through which the light may substantially penetrate, and the enlarged size of the storage capacitor.

Accordingly, it is technically difficult to simultaneously increase the capacitance value of the storage capacitor and size of the opening region, and thus there is a technical problem in enhancing the display performance of an electro-optical device such as a liquid crystal device.

SUMMARY

An advantage of some aspects of the invention is that it provides an electro-optical device which can enhance display performance thereof by simultaneously implementing an increased capacitance value of a storage capacitor and an enlarged size of an opening region, and an electronic apparatus including the electro-optical device.

According to a first aspect of the invention, there is provided an electro-optical device including: a first light shielding film constituting a portion of a display region on a substrate and formed in a non-opening region through which light does not penetrate; a transistor element formed on the first light shielding film to overlap the first light shielding film; a second light shielding film formed on the transistor element to overlap the transistor element and electrically connected to the transistor element; a transparent conductive film formed on the second light shielding film and formed at least in an opening region through which light penetrates; a dielectric film formed on the transparent conductive film in the opening region; and a transparent pixel electrode formed on the dielectric film in the opening region, constituting a storage capacitor together with the transparent conductive film and the dielectric film, and having a transparent pixel electrode which is electrically connected to the transistor element.

With the first electro-optical device of the invention, on the substrate, wiring, such as scanning lines and data lines, and transistor elements are disposed across an insulation film to electrically insulate each other, and are stacked, if necessary, to form a circuit for driving the pixel electrode. A pixel electrode is disposed on an upper layer side. Since each of the scanning lines, the data lines and the pixel switching transistor elements includes opaque constituent elements such as a semiconductor layer and a metal film, it is formed in the non-opening region of the display region on the substrate, through which light does not penetrate, without affecting the image display by the electro-optical device.

The first light shielding film constitutes a portion of the display region on the substrate, and is formed in the non-opening region through which the light does not penetrate. Consequently, the first light shielding film can shield the light incident upon the transistor element from the lower side of the transistor element. In this instance, the non-opening region is defined by an element having a light shielding property of the constituent elements which constitute the electro-optical device, the element including the first light shielding film.

The transistor element is formed on the first light shielding film to overlap the first light shielding film. At the time of operation of the electro-optical device, the transistor element serves as a control element since it is turned ON or OFF in response to, for example, a scanning signal supplied to a gate via the scanning line to control supply or non-supply of the image signal to the pixel electrode.

Since the second light shielding film is formed on the transistor element to overlap the transistor element, it can shield the transistor element from the light at its upper portion side. The second light shielding film is electrically connected to the transistor element. The second light shielding film is electrically connected to, for example, the source of the transistor element, and constitutes a portion of the data line supplying the image signal.

The transparent conductive film is made of a transparent conductive material such as ITO, and is extended toward the upper layer side of the second light shielding film in the opening region of the display region, through which the light penetrates.

The dielectric film is, for example, a transparent film formed on the transparent conductive film in the opening region. It is preferable that the dielectric film is formed to have a thin thickness by using a material having a high dielectric constant in order to increase the capacitance value which will be described below.

The pixel electrode is formed on the dielectric film in the opening region, and constitutes the storage capacitor together with the transparent conductive film and the dielectric film. The pixel electrode is a transparent film electrically connected to the transistor element, and is made of a transparent conductive material such as ITO, similar to the transparent conductive film.

According to the first electro-optical device of the invention, since the storage capacitor is formed in the opening region, it is able to increase the capacitance value as compared with a case in which the storage capacitor is formed only in the non-opening region. In addition, since the storage capacitor is formed of a transparent film, the opening ratio which is a ratio of the opening region occupying the pixel is not lowered, without narrowing the opening region.

Consequently, according to the first electro-optical device of the invention, the capacitance value of the storage capacitor is increased, and the size of the opening region is enlarged, thereby enhancing the display performance of the electro-optical device.

According to the first electro-optical device of the invention, the transparent conductive film has an aperture portion which is formed by partially opening the transparent conductive film in the opening region. A transparent connection portion is extended along the thickness direction of the substrate in the aperture portion, and electrically connects the output terminal and the pixel electrode.

With the invention, while it maximally takes a size of the transparent conductive film constituting one side of a pair of the capacitor electrodes which is a portion of the storage capacitor, an electric connection between the pixel electrode and the output terminal via the connection can be achieved.

According to other aspect of the first electro-optical device of the invention, the electro-optical device includes a relay layer extended toward an upper layer side of the transistor element so as to overlap the transistor element, shielding the transistor element together with the second light shielding film from light, and electrically relaying the transistor element and the pixel electrode.

With the embodiment of the invention, the transistor element can be shielded from the light by both sides of the second light shielding film and the relay layer. Consequently, at the time of operation of the electro-optical device, it is able to reduce light leakage current occurring in the transistor element.

According to other aspect of the first electro-optical device of the invention, the dielectric film may be made of alumina.

With the embodiment of the invention, since the alumina has a dielectric constant relatively higher than other dielectric material, it is able to increase the installable capacitance value in the cases where the size of the storage capacitor is constant.

According to another aspect of the invention, there is provided an second electro-optical device including: a transistor element; a light shielding film placed on the transistor element to overlap the transistor element, and electrically connected to the transistor element; a transparent conductive film placed on the light shielding film and having an aperture portion which is formed over two adjacent pixels; a transparent pixel electrode formed opposite to the transparent conductive film across the dielectric film to constitute a storage capacitor, and electrically connected to the transistor element; a first relay layer being the same layer as the transparent conductive film, placed inside the aperture portion when seen in a plan view, and electrically connecting the pixel electrode and the transistor element; and a second relay layer of an island shape placed on the same layer as the light shielding film, and electrically connecting the pixel electrode and the transistor element.

With the second electro-optical device of the invention, on the substrate, wiring, such as scanning lines and data lines, and transistor elements are disposed across an insulation film to electrically insulate each other, and are stacked, if necessary, to form a circuit for driving the pixel electrode. A pixel electrode is disposed on the upper layer side. Since each of the scanning lines, the data lines and the pixel switching transistor elements includes opaque constituent elements such as a semiconductor layer and a metal film, it is formed in the non-opening region of the display region on the substrate, through which light does not penetrate, without affecting the image display by the electro-optical device.

At the time of operation of the electro-optical device, the transistor element severs as a control element since it is turned ON or OFF in response to, for example, a scanning signal supplied to a gate via the scanning line to control supply or non-supply of the image signal to the pixel electrode.

Since the light shielding film is formed on the transistor element to overlap the transistor element, it can shield the transistor element from the light at its upper portion side. The light shielding film is electrically connected to the transistor element. The light shielding film is electrically connected to, for example, the source of the transistor element, and constitutes a portion of the data line supplying the image signal.

The transparent conductive film is made of a transparent conductive material such as ITO, and is extended toward the upper layer side of the light shielding film in the opening region of the display region, through which the light penetrates.

The dielectric film is, for example, a transparent film formed on the transparent conductive film in the opening region. It is preferable that the dielectric film is formed to have a thin thickness by using a material having a high dielectric constant in order to increase the capacitance value which will be described below.

The pixel electrode is formed on the dielectric film in the opening region, and constitutes the storage capacitor together with the transparent conductive film and the dielectric film. The pixel electrode is a transparent film electrically connected to the transistor element, and is made of a transparent conductive material such as ITO, similar to the transparent conductive film.

The first relay layer is provided on the same layer as the transparent conductive film (i.e., a layer between the pixel electrode and the transistor element). In this instance, the term "same layer" means a layer formed by the same film growing method as the transparent conductive film. The first relay layer is electrically disconnected from the transparent conductive film, and is provided to electrically connect the pixel electrode and the transistor element. More specifically, the first relay layer is electrically connected to, for example, an output terminal side of the transistor of a lower layer side via the contact hole, and is also electrically connected to the pixel electrode of the upper layer side. By providing the first relay layer, the electrical communication between the transistor element and the pixel electrode can be preferably achieved.

The second relay layer is placed in the island shape on the same layer as the light shielding film, and electrically connects the pixel electrode and the transistor element. In this instance, the term "same layer" means a layer formed by the same film growing method as the light shielding film. The second relay layer is electrically disconnected from the light shielding film, and is provided to electrically connect the pixel electrode and the transistor element. More specifically, the second relay layer is electrically connected to, for example, an output terminal side of the transistor of a lower layer side via the contact hole, and is also electrically connected to the pixel electrode of the upper layer side. By providing the second relay layer, the electrical communication between the transistor element and the pixel electrode can be preferably achieved.

According to the second electro-optical device of the invention, since the storage capacitor is formed in the opening region, it is able to increase the capacitance value as compared with the case in which the storage capacitor is formed only in the non-opening region. In addition, since the storage capacitor is formed of a transparent film, a opening ratio which is a ratio of the opening region occupying the pixel is not lowered, without narrowing the opening region.

According to the second electro-optical device of the invention, the transparent conductive film has an aperture portion which is extended to overlap either side of two adjacent pixels, and the pixel electrode is provided to at least partially overlap the aperture portion of the transparent conductive film. Further, the transparent conductive film is electrically connected to the transistor element via the first relay layer which is formed in the aperture portion. In this way, the pixel electrode and the transistor element can be electrically connected to each other via the aperture portion of the transparent conductive film, and since the relay layer is transparent, it is able to prevent reduction of an opening efficiency.

Consequently, according to the second electro-optical device of the invention, the capacitance value of the storage capacitor is increased, and the size of the opening region is enlarged, thereby enhancing the display performance of the second electro-optical device.

According to second electro-optical device of the invention, the first relay layer has a longer length of a first direction, along which a semiconductor layer of the transistor element is extended, than that of the second relay layer.

With the embodiment of the invention, the first relay layer protrudes toward the pixel electrode side, rather than the second relay layer which is provided in the island shape on the same layer as the light shielding film, it is able to promote the electrical connection of the transistor element by passing through the first transparent relay layer, while preventing reduction of the opening ratio.

According to the other embodiment of the second electro-optical device of the invention, the second electro-optical device further includes a capacitor separation film placed on a layer upper than the transparent conductive film and on a layer lower than the pixel electrode, and separating the storage capacitor between adjacent pixels.

With the embodiment of the invention, since the storage capacitor between the adjacent pixels is separated by the capacitor separation film, it is preferable that the quality of the display image can be enhanced. Further, it is able to adjust the size of the storage capacitor by adjusting the area of the capacitor separation film.

According to the other embodiment of the second electro-optical device of the invention, the aperture portion of the transparent conductive film is provided between the adjacent light shielding films. The capacitor separation film has capacitor separation film aperture portions inside the pixel electrode when seen in a plan view and a capacitor separation film aperture portion between the aperture portion and the adjacent light shielding film in a direction intersecting with an extending direction of the light shielding film. The storage capacitor has a shape corresponding with the capacitor separation film aperture portion.

With the embodiment of the invention, the capacitor separation film has a capacitor separation film aperture portion between the light shielding film and the aperture portion of the capacitor electrode, and the storage capacitor is formed corresponding to the shape thereof. Therefore, with the area of capacitor electrode and the pixel electrode being disposed in opposition, the planar area of the storage capacitor region is secured to be as wide as possible.

According to the electro-optical device of the invention, the second electro-optical device further includes a third relay layer provided on a layer between the transistor element and the light shielding film, and electrically relay connecting the transistor element and the pixel electrode. The third relay layer has a body portion extending in a second direction intercrossing with a first direction along which a semiconductor layer of the transistor element is extended, and a protrusion portion protruding from the body portion in the first direction, the third relay layer is disposed to cover a portion of a channel portion of the transistor element and an electrode, which is electrically connected to the pixel electrode, of electrodes on both sides of the channel portion of the transistor element.

With the embodiment of the invention, the third relay layer relays the electrical connection between the transistor element and the pixel electrode, and is provided to cover and shield one of two electrodes interposed between the channel portion in the transistor element, that is, one of source and drain electrodes which is electrically connected to the pixel electrode, and a portion of the channel portion, thereby preventing the light leakage in the transistor element, that is, generation of the current due to light touch. In particular, it is effective that an LDD region between the electrode connected to the pixel electrode and the channel portion is shielded.

According to the other aspect of the invention, there is provided an electronic apparatus including the electro-optical device described above.

According to the electronic apparatus of the invention, the electronic apparatus includes the electro-optical device described above, it can implement various other electronic apparatuses which is capable of performing the display of high quality, such as projection display devices, cellular phones, electronic notebooks, word processors, view-finders or monitor-direct-viewing video tape recorders, workstations, video phones, point-of-sale (POS) terminals, or apparatuses having touch panels. Further, as the electronic apparatus of the invention, an electrophoresis device such as electronic paper can be implemented.

Other operations and advantages of the invention will become apparent from the following description of the embodiments of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Now, an embodiment of an electro-optical device and an electronic apparatus according to the invention will be described with reference to the drawings. As an example of the electro-optical device according to the invention, this embodiment relates to a liquid crystal device employing a TFT active-matrix driving method.

1: Liquid Crystal Device
First Embodiment
1-1: Overall Configuration of Liquid Crystal Device First, the overall configuration of a liquid crystal device 1 according to this embodiment will be described with reference to FIGS. 1 and 2.

Figure 1:
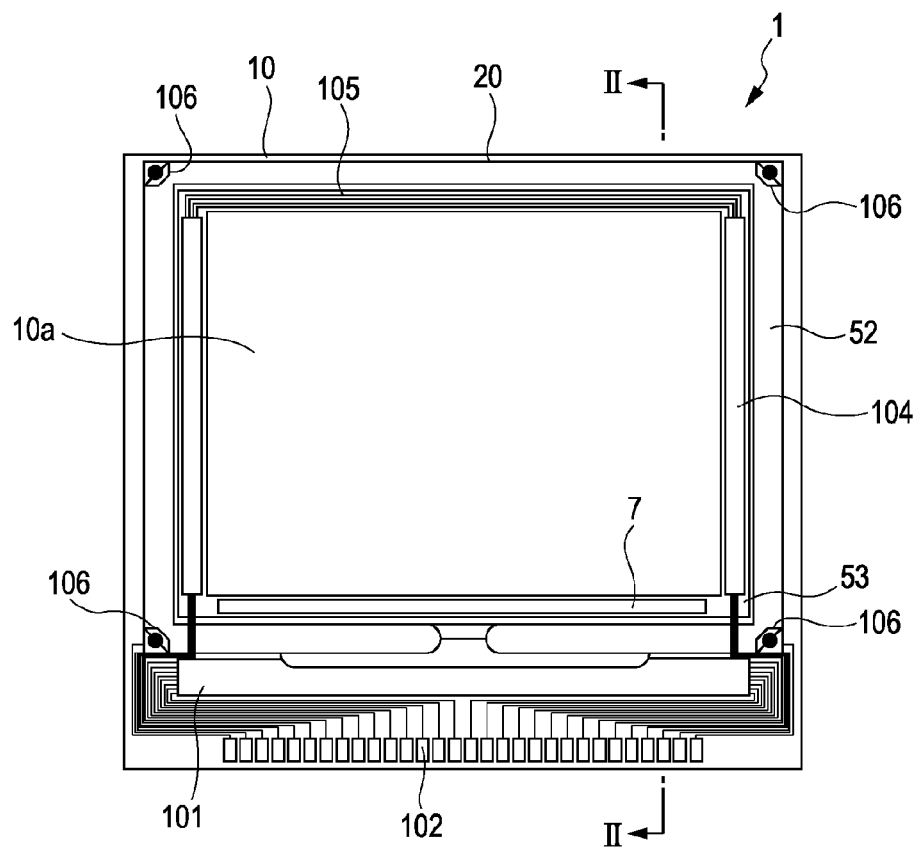
FIG. 1 is a plan view showing the overall configuration of a liquid crystal device according to an embodiment.
Figure 2:
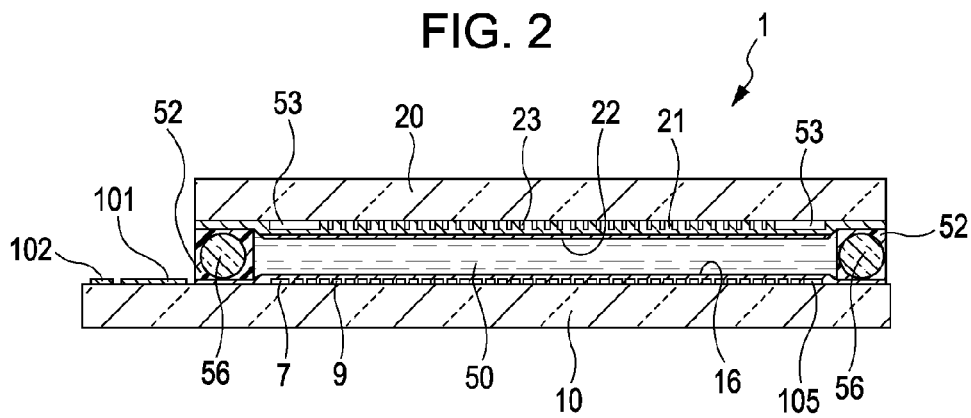
FIG. 2 is a cross-sectional view taken along a line II-II in FIG. 1.

FIG. 1 is a plan view showing the overall configuration of the liquid crystal device 1 according to this embodiment. FIG. 2 is a cross-sectional view taken along a line II-II in FIG. 1.

Referring to FIGS. 1 and 2, the liquid crystal device 1 includes a TFT-array substrate 10 and an opposing substrate 20 which are disposed opposite to each other. The TFT-array substrate 10 is an example of a substrate according to the invention. The TFT-array substrate 10 is, for example, a transparent substrate such as a quartz substrate or a glass substrate, or a silicon substrate. The opposing substrate 20 is a substrate made of, for example, the same material as the TFT-array substrate 10. Between the TFT-array substrate 10 and the opposing substrate 20, liquid crystal is encapsulated to form a liquid crystal layer 50. The TFT-array substrate 10 and the opposing substrate 20 are bonded with each other via a sealing member 52 provided in a sealing region which is placed around an image display region 10a, in which electro-optical operation is carried out. The image display region 10a is an example of a "display region" in the invention.

The sealing member 52 is composed of an ultraviolet curing resin, a thermosetting resin, or the like for bonding the TFT-array substrate 10 and the opposing substrate 20 with each other. The sealing member 52 is formed by applying such a material onto the TFT-array substrate 10 and curing the material by ultraviolet irradiation, heating, or the like in a manufacturing process. Further, for example, in the sealing member 52, a gap member 56 composed of glass fibers or glass beads are dispersed so that a gap of a predetermined value is provided between the TFT-array substrate 10 and the opposing substrate 20 (i.e., an inter-substrate gap).

Inside and in parallel to the sealing region in which sealing member 52 is disposed, a frame-shaped light shielding film 53 having a light shielding property which defines a frame region of the image display region 10a is provided on the opposing substrate 20. Alternatively, the frame-shaped light shielding film 53 may be formed entirely or partially on the TFT-array substrate 10 as an internal light shielding film.

In a peripheral region located around the image display region 10a on the TFT-array substrate 10, a data-line driving circuit 101, a sampling circuit 7, scanning-line driving circuits 104, and external-circuit connecting terminals 102 are respectively provided.

In the peripheral region on the TFT-array substrate 10, the data-line driving circuits 101 and the plurality of external-circuit connecting terminals 102 are provided along one edge of the TFT-array substrate 10 in a region located outside the sealing region.

Furthermore, in the region inside the sealing region of neighboring regions on the TFT array substrate 10, the sampling circuit 7 is provided along one side of the image display region 10a which is along one side of the TFT-array substrate 10, and is covered by the frame-shaped light shielding film 53.

In addition, the scanning-line driving circuits 104 are provided along two edges of the TFT-array substrate 10 adjacent to the one edge thereof, and are covered by the frame-shaped light shielding film 53. Further, in order to electrically interconnect the two scanning-line driving circuits 104 provided on both sides of the image display region 10a, a plurality of wiring 105 are provided along the remaining one edge of the TFT-array substrate 10, and is covered by the frame-shaped light shielding film 53.

In the peripheral regions on the TFT-array substrate 10, vertical-conduction terminals 106 are provided in the regions facing a portion of four corners on the opposing substrate 20, and vertical-conduction members are provided between the TFT-array substrate 10 and the opposing substrate 20 and are electrically connected to the vertical-conduction terminals 106 corresponding to the vertical-conduction terminals 106.

Referring to FIG. 2, a laminate structure including TFTs for pixel switching or wiring such as scanning lines, data lines or the like is formed on the TFT-array substrate 10. In the image display region 10a, a pixel electrode 9 is provided in a matrix shape on the pixel switching TFT or the wiring such as scanning lines, data lines or the like. The pixel electrode 9 is formed of a transparent electrode made of an ITO film. An alignment film 16 is formed on the pixel electrode 9.

On the opposing substrate 20, a light shielding film 23 is provided on the surface opposite to the TFT-array substrate 10. The light shielding film 23 is made of, for example, a light shielding metal film, and is patterned, for example, in a grid shape in the image display region 10a on the opposing substrate 20. An opposing electrode 21 made of an ITO film is provided, for example, as a solid opposite to the plurality of pixel electrodes 9 on the light shielding film 23 (lower than the light shielding film 23 in FIG. 2), and an alignment film 22 is further provided on the opposing electrode 21 (lower than the opposing electrode 21 in FIG. 2).

The liquid crystal layer 50 is composed of, for example, one type of nematic liquid crystal or a combination of more than one type of nematic liquid crystal, and exhibits a predetermined orientation between the pair of alignment films. If the liquid crystal device is driven, the pixel electrodes 9 and the opposing electrodes 21 are applied by voltage to form a liquid crystal holding capacitance between the pixel electrodes 9 and the opposing electrodes 21.

In this instance, although now shown herein, in addition to the data-line driving circuit 101 and the scanning-line driving circuits 104, a precharging circuit that supplies precharging signals at a predetermined voltage level to plural data lines before image signals are supplied, a testing circuit for testing the quality, defects, or the like of the liquid crystal device during manufacturing or at the time of shipping, and so forth may be provided on the TFT-array substrate 10.

1-2: Electric Configuration of Liquid Crystal Device

Figure 3:
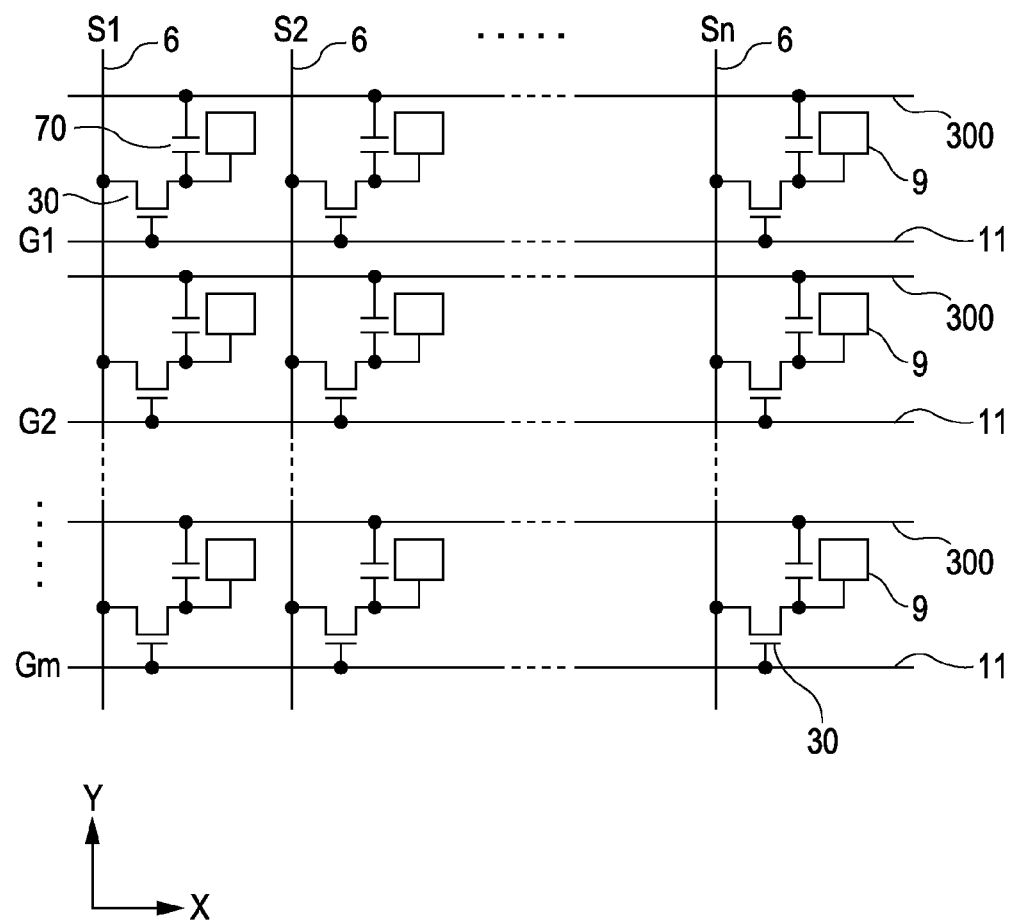
FIG. 3 is a circuit diagram showing the electric configuration of the liquid crystal device according to the embodiment.

Next, the electrical configuration in the image display region 10a of the liquid crystal device 1 will be described with reference to FIG. 3. FIG. 3 is an equivalent circuit diagram of various elements, wiring and so forth in a plurality of pixels arranged in a matrix shape to constitute the image display region 10a of the liquid crystal device 1 according to this embodiment.

Referring to FIG. 3, at each of the plurality of pixels arranged in the matrix shape to constitute the image display region 10a, the pixel electrode 9 and the TFT 30 which is an example of a "transistor element" in the invention are provided. The TFT 30 is electrically connected to the pixel electrode 9. The TFT 30 controls switching of the pixel electrode 9 so as to switch supply and non-supply of an image signal to the pixel electrode 9 during operation of the liquid crystal device 1. A data line 6, through which the image signal is supplied, is electrically connected to the source region of the TFT 30. Image signals S1, S2, . . . , Sn written to the data lines 6 may be supplied sequentially line by line in this order, or in groups to sets of adjacent data lines 6.

The gate of the TFT 30 is electrically connected to a scanning line 11. The liquid crystal device 1 is configured so that pulses of scanning signals G1, G2, . . . , Gm are applied to the scanning lines 11 sequentially in this order at specific timings. The pixel electrode 9 is electrically connected to the drain of the TFT 30, and the TFT 30 serving as a switching element is turned off for a predetermined period, so that the image signals S1, S2, . . . , Sn supplied from the data lines 6 are written at specific timings. The image signals S1, S2, . . . , Sn having certain levels which are written to the liquid crystal via the pixel electrodes 9 are maintained for a predetermined period between the pixel electrodes 9 and the opposing electrode 21 (see FIG. 2) formed on the opposing substrate 20 (see FIG. 2).

The liquid crystal constituting the liquid crystal layer 50 (see FIG. 2) changes the orientation or order of its molecules according to the levels of voltages applied thereto, thereby modulating light to achieve multi-level display. In a normally white mode, the transmittance of incident light decreases in accordance with voltages applied to the individual pixels. On the other hand, in a normally black mode, the transmittance of incident light increases in accordance with voltages applied to the individual pixels. Thus, as a whole, light having contrast according to image signals is output from the liquid crystal device.

In order to prevent leakage of the image signals maintained, for each of the liquid crystal capacitors formed between the pixel electrodes 9 and the opposing electrodes 21 (see FIG. 2), a storage capacitor 70 is electrically connected in parallel.

1-3: Specific Configuration of Liquid Crystal Device

Figure 4:
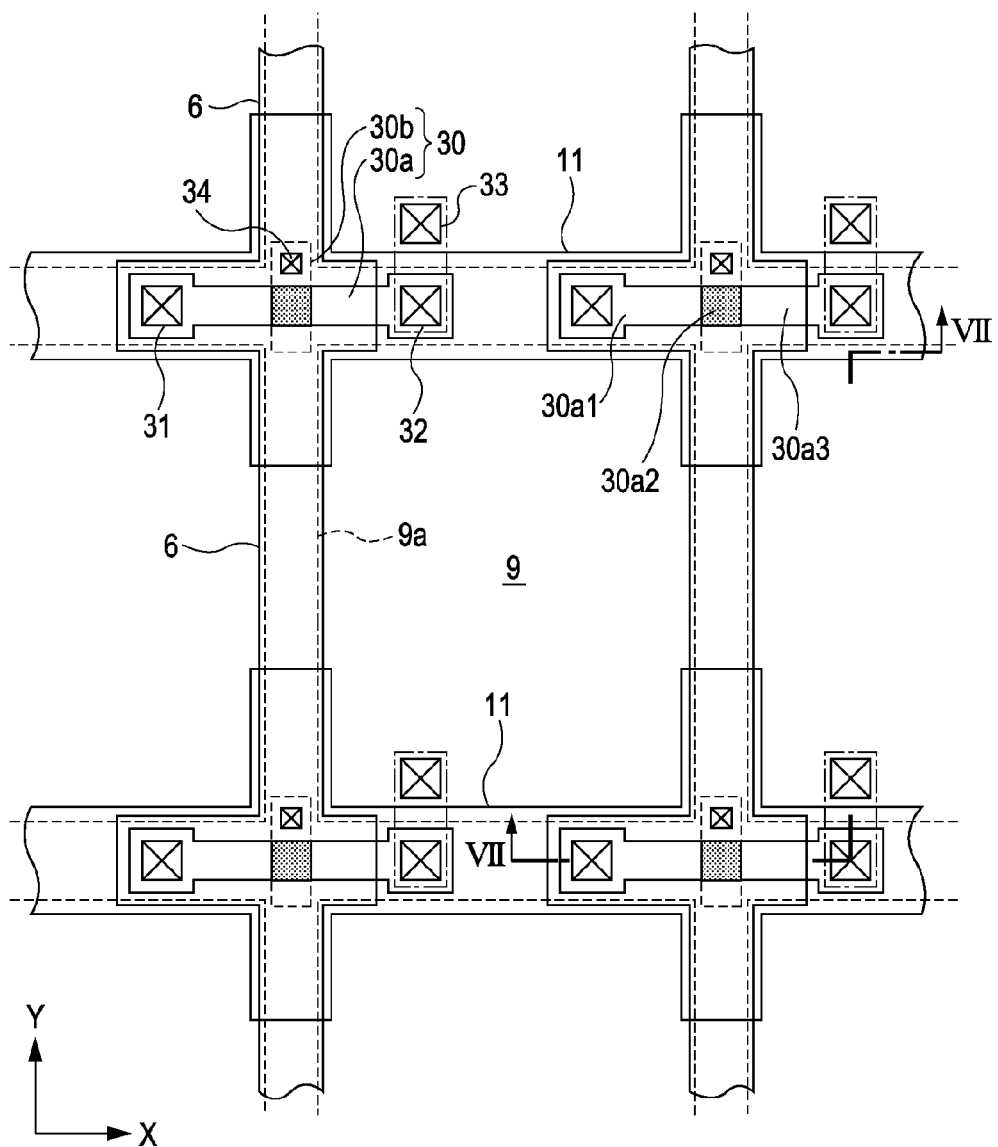
FIG. 4 is a diagram transparently showing a position relationship, such as wiring, in an image display region in the liquid crystal device according to the embodiment.
Figure 5:
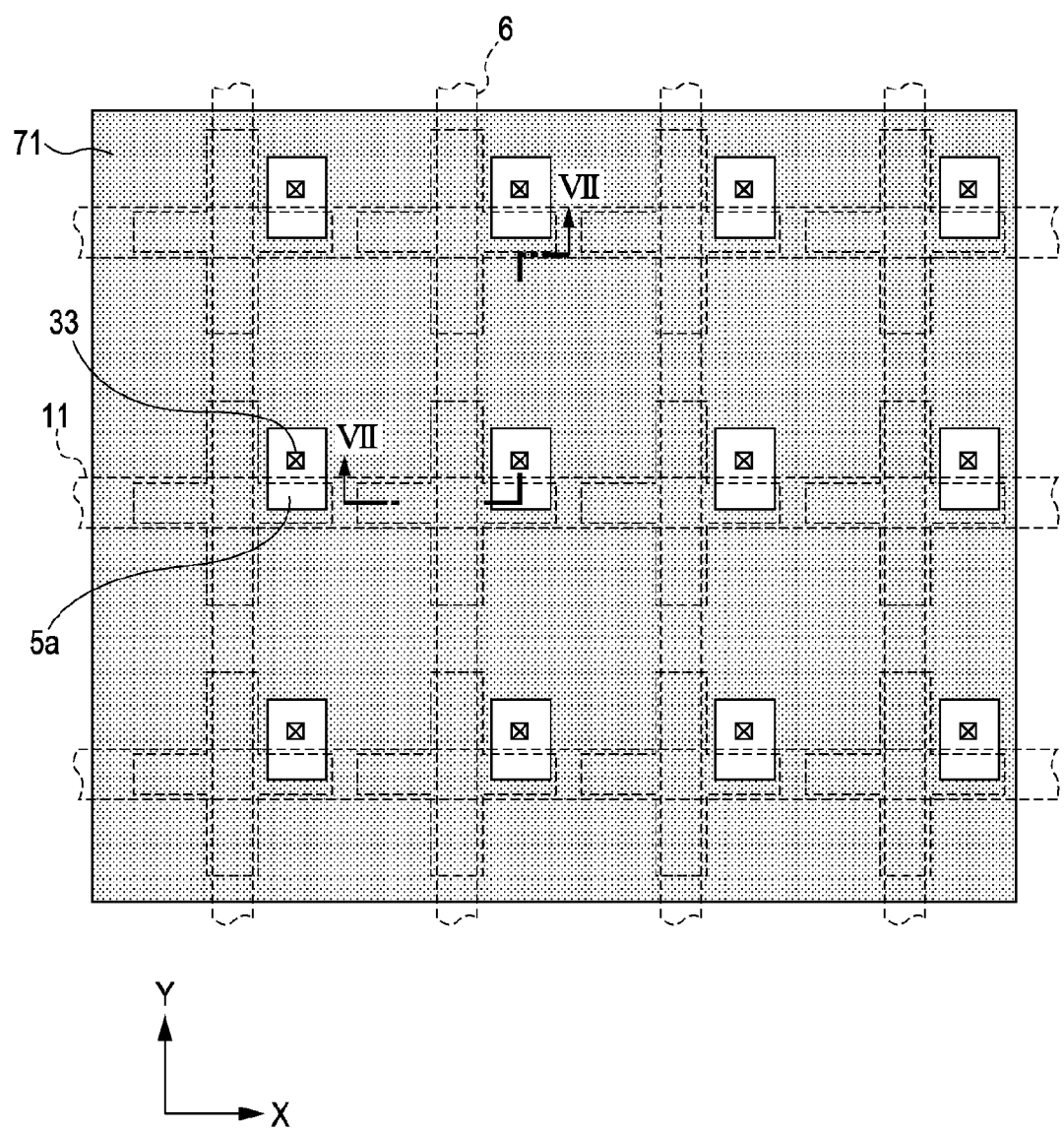
FIG. 5 is a plan view showing layout of the respective constituent elements on one layer of different layers in the liquid crystal device according to the embodiment.
Figure 6:
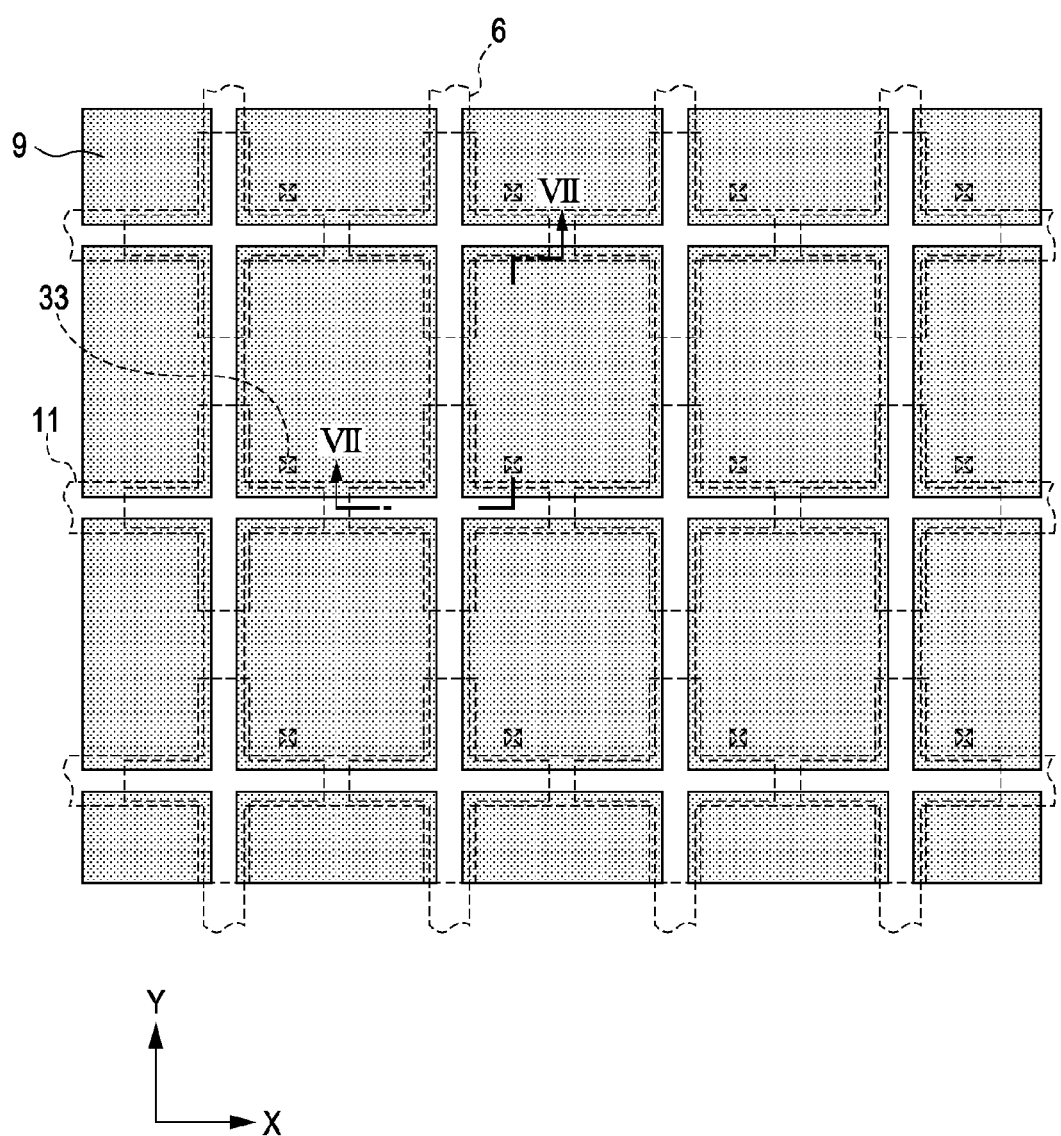
FIG. 6 is a plan view showing layout of the respective constituent elements on the other layer of different layers in the liquid crystal device according to the embodiment.
Figure 7:
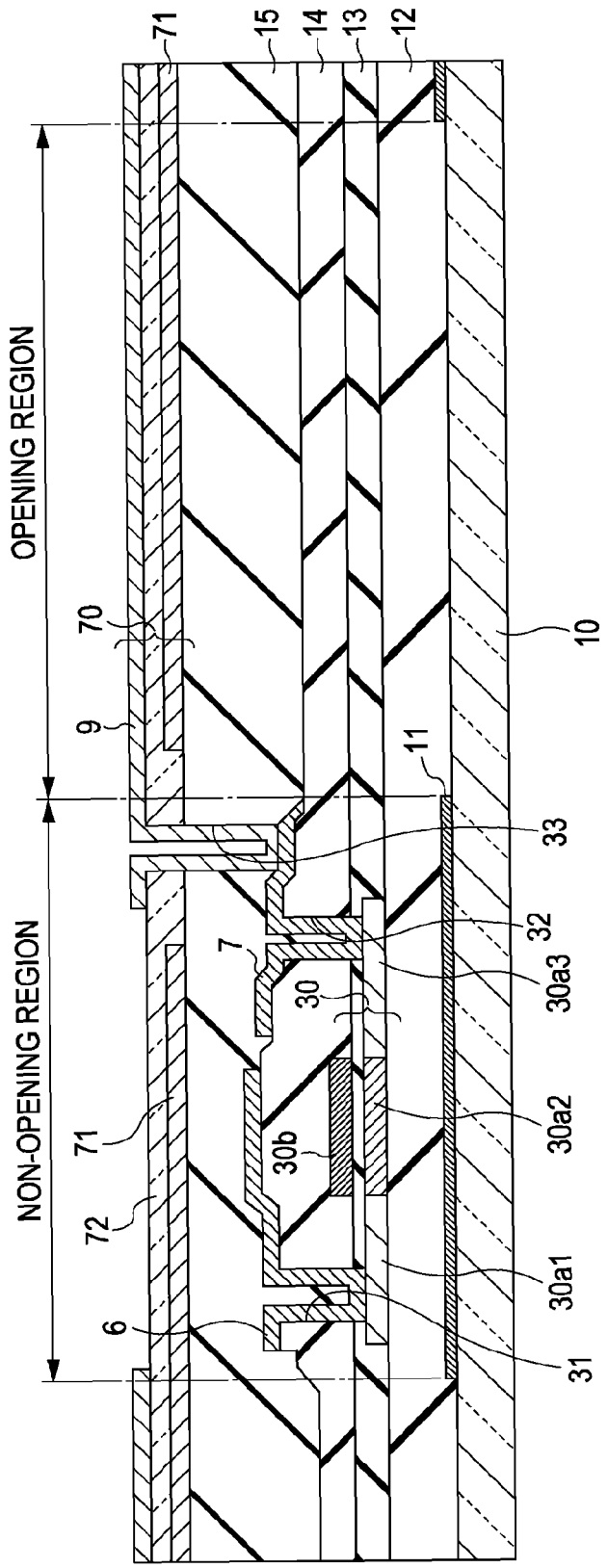
FIG. 7 is a cross-sectional view taken along a line VII-VII in FIGS. 4 to 6.

Next, a specific configuration of the pixels of the liquid crystal device 1 will be described with reference to FIGS. 4 to 7. FIG. 4 is a plan view schematically showing a position relationship, such as electrodes and wiring which are disposed to perform the electro-optical operation, in the image display region 10a of the liquid crystal device 1 according to the embodiment. FIGS. 5 and 6 are plan views showing in detail the configuration of a portion of the image display region 10a. FIGS. 5 and 6 shows different layers on the TFT-array substrate 10 in a solid line, and show a plan structure in the region slightly wider FIG. 4. FIG. 7 is a cross-sectional view taken along a line VII-VII in FIGS. 4 to 6. In this instance, in FIGS. 4 to 7, each of the layers and each of the members are shown in different scales in order to illustrate the respective layers and the respective members in a perceptible size on the figure.

In FIG. 4, on the TFT array substrate 10, the scanning lines 11 serving as a "first light shielding film" of the invention and the data lines 6 serving as a "second light shielding film" of the invention are extended in an X direction and a Y direction, respectively. The TFT 30 (i.e., a semiconductor layer 30a and a gate electrode 30b) is formed to overlap the scanning line 11 at the region adjacent to the intersection of the data line 6 and the scanning line 11. The scanning line 11 is made of a light shielding conductive material, for example, W (tungsten), Ti (titanium), TiN (titanium nitride) or the like, and is formed to have a width wider than the semiconductor layer 30a so as to include the semiconductor layer 30a of the TFT 30. As described above, since the scanning line 11 is placed at a layer side lower than the semiconductor layer 30a, the scanning line 11 is formed to have a width wider than the semiconductor layer 30a of the TFT 30, thereby almost or completely shielding the channel region 30b of the TFT 30 from the return light such as back-side reflection in the TFT-array substrate 10 or the light produced from another liquid crystal device, such as a projector of a duplicated plate type and penetrating a synthesis optical system. As a result, at the time of operation of the liquid crystal device 1, light leakage current can be reduced in the TFT 30, thereby enhancing a contrast ratio and thus enabling an image of high quality to display.

Since the scanning line 11 has a light shielding property, the scanning line defines a non-opening region in the image display region 10a together with the data line 6. In this instance, each of the scanning lines 11 and the data lines 6 may be formed in such a way that an edge of each scanning lines 11 and the data lines 6 does not define the non-opening region. In other words, each of the scanning lines 11 and the data lines 6 may be formed in the non-opening region defined by other light shielding film which is formed on the TFT-array substrate 10.

The TFT 30 includes the semiconductor layer 30a and the gate electrode 30b. The semiconductor layer 30a is configured to have a source region 30a1, a channel region 30a2, and a drain region 30a3. Here, at an interface between the channel region 30a2 and the source region 30a1 or the channel region 30a2 and the drain region 30a3, an LDD (Lightly Doped Drain) region may be formed.

The gate electrode 30b is formed in the region which overlaps the channel region of the semiconductor layer 30a, when seen in a plan view over the TFT-array substrate 10, with a gate insulation film being interposed therebetween. Although not shown in FIG. 4, the gate electrode 30b is electrically connected to the scanning line 11 which is placed at a lower layer, via a contact hole 34. If a scanning signal is applied to the gate electrode 30b, the gate electrode controls ON/OFF of the TFT 30.

Since the data line 6 is placed on the TFT 30 and thus overlaps the TFT 30, the data line can shield the light from the TFT 30 at the upper side. The data line 6 is electrically connected to the contact hole 31 which is an example of an "input terminal" of the invention. The data line 6 is electrically connected to, for example, the source region 30a1 (see FIG. 7) of the TFT 30, and constitutes a portion of the data line supplying the image signal to the TFT 30.

Meanwhile, the drain region 30a3 is electrically connected to the pixel electrode 9 via a contact hole 32 and a relay layer 7 which constitute an example of an "output terminal" of the invention and a contact hole 33 which is an example of a "connection portion" of the invention (see FIG. 7).

In FIG. 5, a capacitor electrode 71 which is an example of a "transparent conductive film" of the invention is made of, for example, a transparent conductive material such as ITO, and constitutes a pair of capacitor electrodes together with the pixel electrode 9 in a storage capacitor 70. The capacitor electrode 71 overlaps the substantially whole portion of the image display region 10a, and is extended towards the upper layer side of the data line 6 in an opening region through which the light penetrates.

Each of the data lines 6 and the scanning lines 11 is extended in the Y direction and the X direction, respectively. Each of the pixels is divided by the data lines 6 and the scanning lines 11. The capacitor electrode 71 is formed on the layer side lower than the pixel electrode 9 (not shown in FIG. 5), and an aperture portion 5a every pixel. In the aperture portion 5a, the contact hole 33 which electrically connects the pixel electrode 9 and the drain region 30a3 (see FIG. 7) is formed in a vertical direction on the figure, that is, along a thickness direction of the TFT-array substrate 10. Consequently, according to the contact hole 33, the capacitor electrode 71 formed on the lower layer side of the pixel electrode 9 is not electrically short-circuited, and can supply an image signal potential output from the drain region 30a3 to the pixel electrode 9. As a result, even though the capacitor electrode 71 is provided on the lower layer side of the pixel electrode 9, it is able to drive the pixel electrode 9 On/OFF, so that the liquid crystal device 1 having very effective wiring layout can be implemented.

In FIG. 6, the pixel electrode 9 is formed in an island shape for every pixel. In this embodiment, each pixel is divided in a matrix shape by the data lines 6 and the scanning lines 11. As shown by a dotted line 9a in FIG. 4, the pixel electrode 9 is formed to partially overlap the data line 6 and the scanning line 11 in the respective pixels, when seen in a plan view on the TFT-array substrate 10. The storage capacitor 70 is formed in a region in which the capacitor electrode 71 and the pixel electrode 9 overlap each other.

In FIG. 7, on the TFT-array substrate 10, insulation films 12, 13, 14 and 15 and a dielectric film 72 are formed. Each of the scanning lines 11, the TFT 30, the data lines 6, the capacitor electrodes 71 and the pixel electrodes 9 is formed on the TFT-array substrate 10, the insulation film 12, the insulation film 14, the insulation film 15 and the dielectric film 72, respectively.

The dielectric film 72 is a transparent film formed on the capacitor electrode 71 in the opened region through which the light penetrates. The dielectric film 72 is made of alumina having a dielectric constant relatively higher than other dielectric films, and forms the storage capacitor 70 together with the capacitor electrode 71 and the pixel electrode 9 in the opening region. Since alumina has a dielectric constant relatively higher than other dielectric material, it is able to increase a settable capacitance value in the case in which the size of the storage capacitor 70 is constant. In this instance, it is preferable to make a film thickness of the dielectric film 72 thin so as to increase the capacitance value of the storage capacitor 70.

Since each of the storage capacitors 70 includes the transparent capacitor electrode 71, the dielectric film 72 and the pixel electrode 9, the opening region may not be narrowed, and an opening ratio which is a ratio of the opening region occupying the pixel is not lowered. Further, according to the storage capacitor 70, since the storage capacitor 70 is formed in the opening region, it is able to increase the capacitance value thereof as compared with the case in which the storage capacitor is formed only in the non-opening region.

Consequently, according to the liquid crystal device 1, the capacitance value of the storage capacitor 70 may be increased, and the size of the opening region may be enlarged, thereby enhancing the display performance of the liquid crystal device 1.

Modified Example

Figure 8:
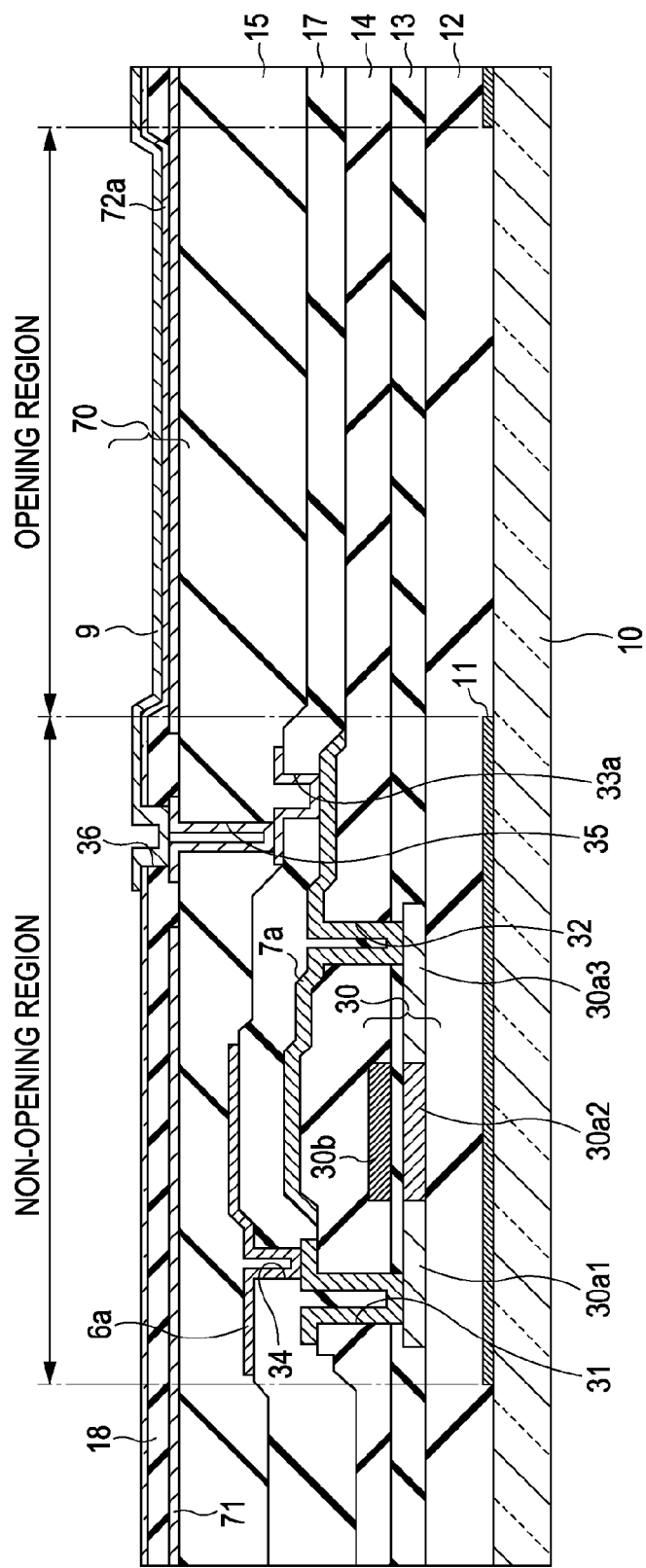
FIG. 8 is a partial cross-sectional view showing a liquid crystal device according to a modified example.

Next, a modified example of the liquid crystal device 1 according to this embodiment will be described with reference to FIG. 8. FIG. 8 is a cross-sectional view showing the configuration of the modified example of the liquid crystal device according to this embodiment, and is a partial cross-sectional view taken by cutting the liquid crystal device according to the modified example in the cross section corresponding to FIG. 7. In this instance, common parts to the liquid crystal device 1 are designated by same reference numerals, and the detailed description thereof will be omitted.

In FIG. 8, the liquid crystal device according to this embodiment is different from the above-described liquid crystal device 1, except for a relay layer 7a, data lines 6a, contact holes 33a, 34, 35 and 36, insulation films 17 and 18 and a dielectric film 72a.

The dielectric film 72a is made of alumina, similar to the dielectric film 72, and constitutes the storage capacitor 70 together with the capacitor electrode 71 and the pixel electrode 9. In this instance, in the non-opening region constituting a portion of the image display region 10a, the insulation film 18 is extended between the pixel electrode 9 and the capacitor electrode 71. The pixel electrode 9 is electrically connected to the drain region 30a3 via the contact holes 36, 35 and 33a, the relay layer 7a and the contact hole 32. According to the liquid crystal device of this embodiment, the capacitance value of the storage capacitor 70 is increased, and the size of the opening region is enlarged, thereby enhancing the display performance of the liquid crystal device 1, similar to the above-described liquid crystal device 1.

The data line 6a is an example of a "second light shielding film" of the invention, and is formed on the insulation film 17. The data line 6a is electrically connected to the contact hole 31 via the contact hole 34.

The relay layer 7a and the contact hole 32 constitute an example of an "output terminal" of the invention. The relay layer 7a is extended towards the upper layer side of the TFT 30 to overlap the TFT 30 to shield the TFT 30 from the light together with the data line 6a and electrically relay the TFT 30 and the pixel electrode 9.

Consequently, according to the liquid crystal device, it is able to shield the TFT 30 from the light at both sides of the data line 6a and the relay layer 7a. Therefore, it is able to eliminate light leakage current produced in the TFT 30, at the time of operation of the liquid crystal device.

Second Embodiment

Next, a liquid crystal device according to the second embodiment will be described with reference to FIGS. 9 to 11. In this instance, the second embodiment is substantially identical to the first embodiment, except for some configurations. For this reason, in the second embodiment, the portions different from those of the first embodiment will be described in detail, and the same portions will be not described herein.

Figure 9:
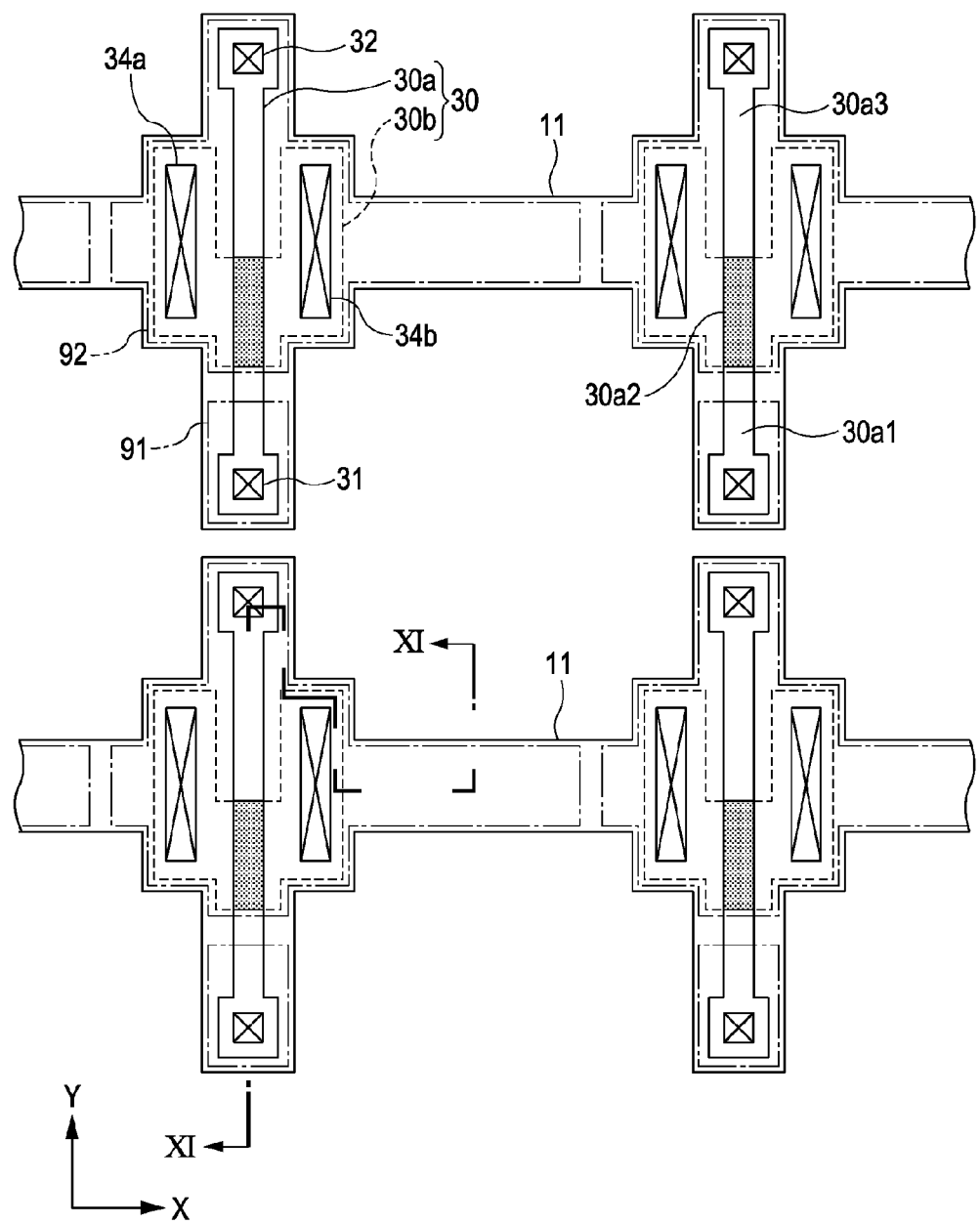
FIG. 9 is a plan view transparently showing a position relationship of the respective layers constituting a liquid crystal device according to a second embodiment.
Figure 10:
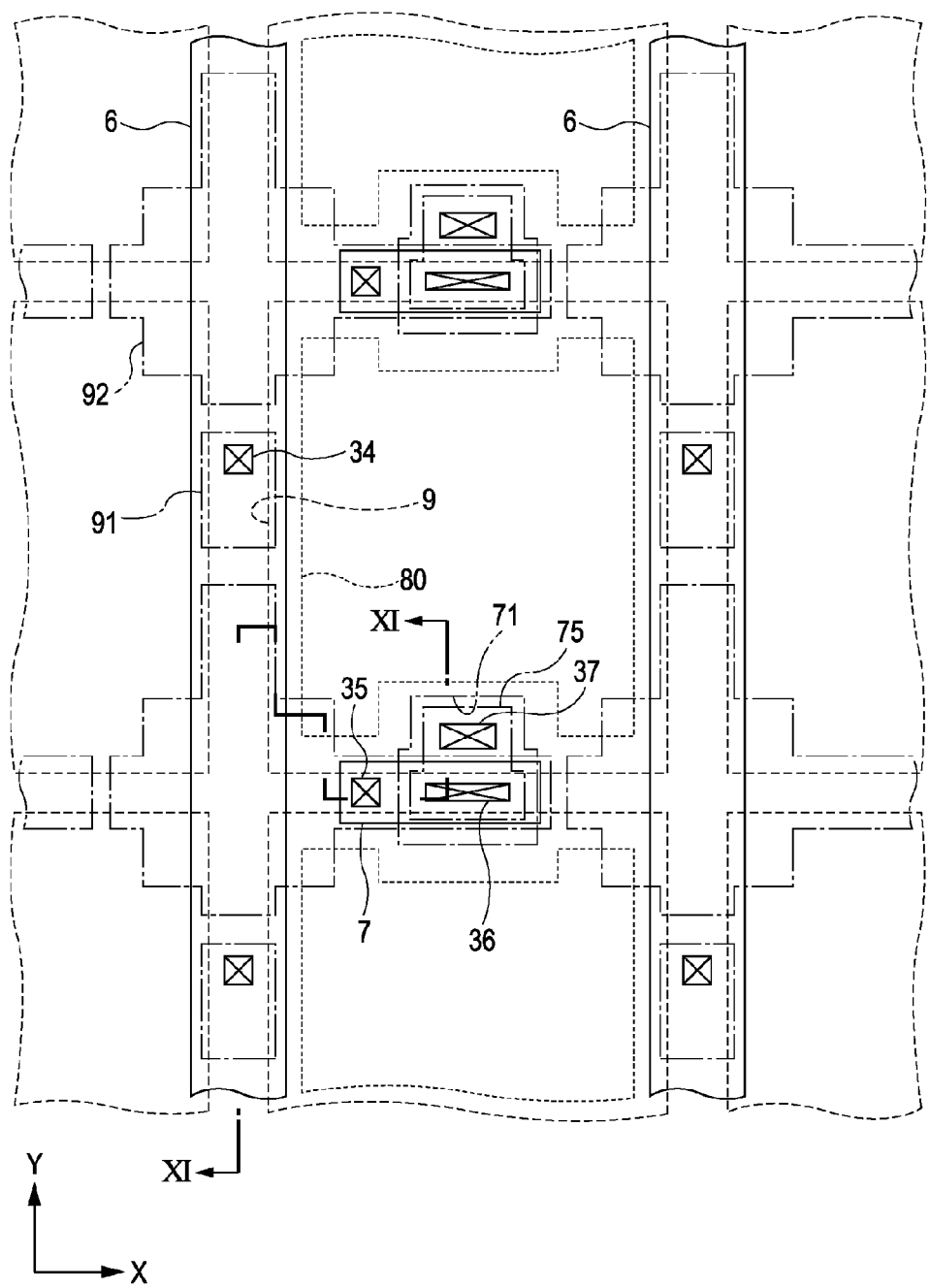
FIG. 10 is a plan view transparently showing a position relationship of the respective layers constituting a liquid crystal device according to a second embodiment.

FIGS. 9 and 10 are plan views transparently showing a positional relationship of the respective layers constituting the liquid crystal device according to the second embodiment. FIG. 11 is a cross-sectional view showing a laminate structure of the liquid crystal device according to the second embodiment. In this instance, in FIG. 9, each layer lower than the relay layer 91 and 92 is shown, and in FIG. 10, each layer higher than the relay layer 91 and 92 is shown. Further, in FIGS. 9 to 11, each of the layers and each of the members are shown in different scales in order to illustrate the respective layers and the respective members in a perceptible size on the figure. FIG. 11 shows a cross section taken along a line XI-XI in FIGS. 9 and 10, but since the scale of the respective layers and the respective members are different, there are portion which do not absolutely correspond to the line XI-XI.

Figure 11:
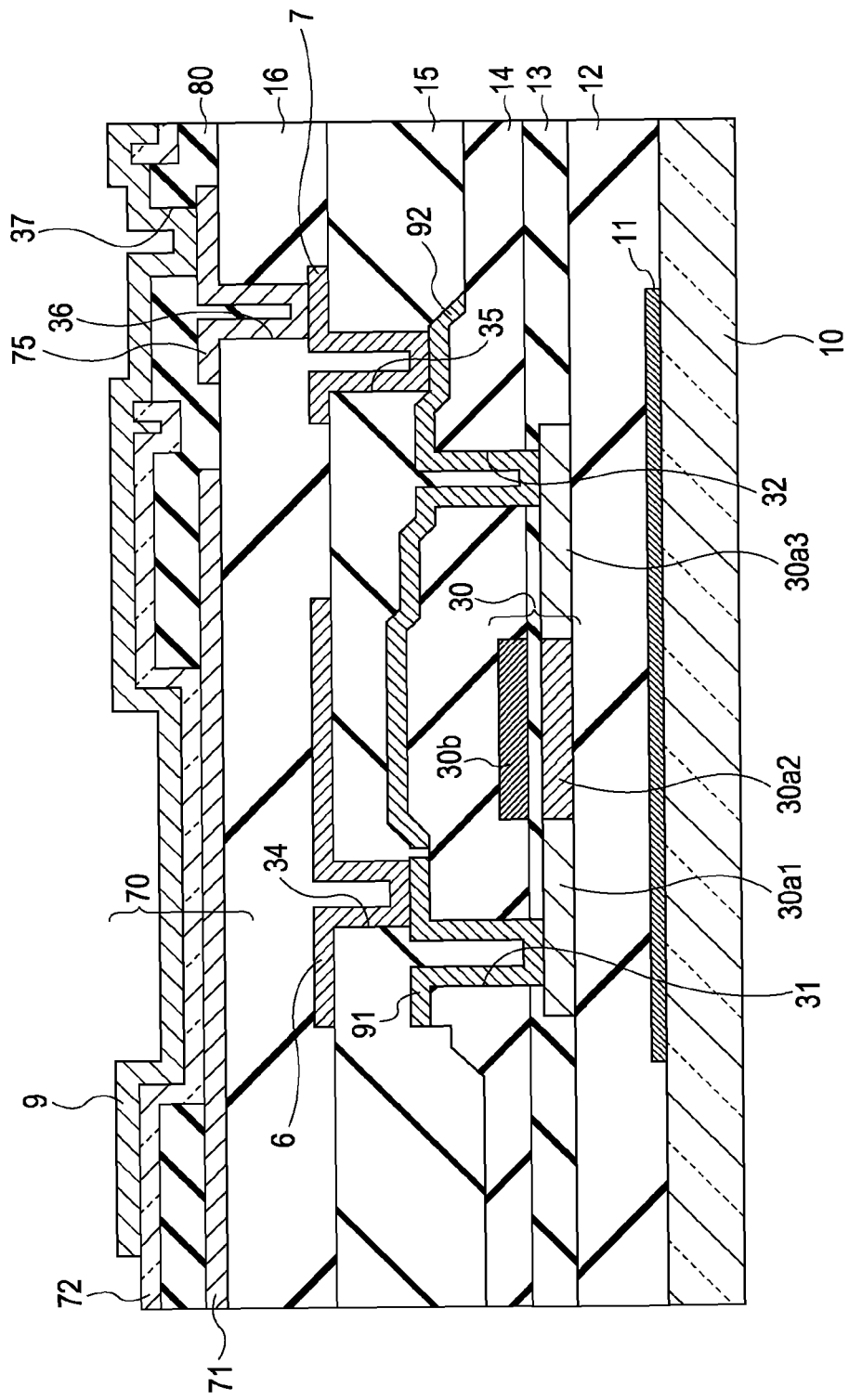
FIG. 11 is a cross-sectional view showing a laminate structure of the liquid crystal device according to the second embodiment.

In FIGS. 9 and 11, on the TFT-array substrate 10, the scanning lines 11 are disposed along an X direction, and the TFT 30 having the semiconductor layer 30a and the gate electrode 30b is disposed on an upper layer of the scanning lines 11, with an underlying insulation film 12 being interposed therebetween.

The scanning line 11 is made of a light shielding conductive material, for example, W (tungsten), Ti (titanium), TiN (titanium nitride) or the like, and is configured to include the semiconductor layer 30a when seen in a plan view on the TFT-array substrate 10. More specifically, as shown in FIG. 10, the scanning line 11 has a protrusion portion protruding along the semiconductor layer 30a in the Y direction. Since the scanning line 11 is placed on a layer lower than the semiconductor layer 30a and has the above-described protrusion portion, the protrusion portion can almost or completely shield the channel region 30b of the TFT 30 from the return light such as back-side reflection in the TFT-array substrate 10 or the light produced from other liquid crystal device, such as a projector of a duplicated plate type and penetrating a synthesis optical system. As a result, at the time of operation of the liquid crystal device, light leakage current can be reduced in the TFT 30, thereby enhancing a contrast ratio and thus enabling an image of high quality to display.

The TFT 30 includes the semiconductor layer 30a and the gate electrode 30b. The semiconductor layer 30a is configured to have a source region 30a1, a channel region 30a2, and a drain region 30a3. Here, at an interface between the channel region 30a2 and the source region 30a1 or the channel region 30a2 and the drain region 30a3, an LDD (Lightly Doped Drain) region may be formed.

The gate electrode 30b is formed on the upper layer side of the semiconductor layer 30a in the region which overlaps the channel region 30a2 of the semiconductor layer 30a, at plane view over the TFT-array substrate 10, with a gate insulation film 13 being interposed therebetween. The gate insulation electrode 30b is made of, for example, conductive polysilicon, and is electrically connected to the scanning line 11 disposed on a lower layer side via the contact holes 34a and 34b.

The source region 30a1 of the TFT 30 is electrically connected to the relay layer 91 formed on a first interlayer dielectric 14 via the contact hole 31. The drain region 30a3 is electrically connected to the relay layer 92 formed as the same layer as the relay layer 91 via the contact hole 32. The relay layer 92 is an example of a "third relay layer" of the invention.

In FIGS. 10 and 11, the relay layer 91 is electrically connected to the data lines 6 formed on a second interlayer dielectric 15 via the contact hole 34. The data line 6 is an example of a "light shielding layer" of the invention. The relay layer 92 is electrically connected to the relay layer 7 formed as the same layer as the data lines 6 via the contact hole 34. The data line 6 is an example of a "second light shielding layer" of the invention, and the relay layer 7 is an example of a "second relay layer" of the invention.

The relay layer 7 is electrically connected to the relay layer 75 formed on the same layer as the capacitor electrode 71, which will be described below, via the contact hole 36. In this instance, the relay layer 75 is an example of "a first relay layer" of the invention. The relay layer 75 is electrically connected to the pixel electrode 9 via the contact hole 37. That is, the drain region 30a3 of the TFT 30 and the pixel electrode 9 are electrically relay-connected to each other via the relay layer 92, the relay layer 7 and the relay layer 75 in this order.

On the data lines 6 and the relay layer 7, the storage capacitor 70 is formed, with a third interlayer dielectric 16 being interposed therebetween. Since the storage capacitor 70 is electrically connected in parallel to the liquid crystal capacitor, it is able to maintain the voltage of the pixel electrode 9, for example, by a time three-digits longer than the time for which the image signal is applied. Therefore, a sustain characteristic of the liquid crystal element is improved, and thus the liquid crystal device having high contrast ratio can be implemented.

The capacitor electrode 71 is an example of a "transparent conductive film" of the invention, and serves as one electrode of the storage capacitor 70 which is electrically connected in parallel to the liquid crystal capacitance. The capacitor electrode 71 is electrically connected to a capacitance wiring 300, and thus is maintained in a fixed potential. The capacitor electrode 71 is made of, for example, a transparent electrode such as ITO. For this reason, even though the capacitor electrode 71 is formed to overlap the image display region 10a including the opening region, a light transmittance in the opening region is not almost or never decreased in practice. The capacitor electrode 71 is formed to enclose the relay layer 75 which is formed in an island shape. In other words, the relay layer 75 is formed inside the aperture portion of the capacitor electrode 71. The relay layer 92 has a body portion overlapping along the scanning line 11, and a protrusion portion disposed to cover the drain region a3 from a portion of at least channel region of the TFT 30 which is vertically disposed. The relay layer 7 has an island shape overlapping along the body portion of the relay layer 92. Further, the relay layer 75 is installed in such a way that its vertical width is wider than the relay layer 7 so as to protrude from the relay layer 92 of the island shape towards the pixel electrode side. The aperture portion of the capacitor electrode 71 is opened so as to provide the contact hole 36 which is connected to the relay layer 7 and the relay layer 75, and the contact hole 37 which is connected to the relay layer 75 and the pixel electrode 9. The relay layer 7 is made of the same light shielding material as the data line, and is provided between a pixel and a pixel. The relay layer 75 is made of the same transparent material as the capacitor electrode 71, and even though it protrudes toward the pixel electrode side, the opening ratio of the image display region 10a is not deteriorated. Since the aperture portion of the capacitor electrode 71 is provided across two pixels of a vertical direction, by providing the transparent relay layer 75 inside the aperture portion thereof, it is able to ensure a margin for providing the relay layer 7 of a light shielding material and the contact hole 36 at the position between the pixel electrodes, and simultaneously providing the contact hole 36 at the position overlapping the relay layer 7.

The dielectric film 72 is formed on the capacitor electrode 71. The dielectric film 72 is formed as a solid to cover the capacitor electrode 71. In this instance, since the dielectric film 72 is made of nitride silicon which is a transparent dielectric material, even though the dielectric layer 72 is widely formed on the image display region 10a including the opening region, the light transmittance in the opening region is not almost or never decreased in practice. Meanwhile, it is preferable to make a film thickness of the dielectric film 72 thin so as to increase the capacitance value of the storage capacitor 70.

Further, a capacitor separation film 80 for separating the storage capacitor 70 between the pixels is provided on the capacitor electrode 71. The capacitance value of the storage capacitor 70 can be adjusted by increasing or decreasing an area of the capacitor separation film 80. More specifically, by providing the capacitor separation film 80, the storage capacitor 70 is not formed at the portion in which the capacitor electrode 71 is not provided opposite to the pixel electrode 9 across the dielectric film 72. As shown in FIG. 10, the capacitor separation film 80 has a capacitor separation film aperture portion which is formed in an approximately H-shape so as to avoid the aperture portion of the capacitor electrode 71 over the pixel adjacent to the capacitor separation film 80. The capacitor electrode 71 and the pixel electrode 9 are placed opposite to each other to form the storage capacitor 70 in accordance with the shape of the aperture portion of the capacitor separation film. That is, the aperture portion of the capacitor separation film is provided between the data lines 6 adjacent to the aperture portion of the capacitor electrode which is provided between the adjacent data lines 6, to form the storage capacitor, so that a planar area of the storage capacitor region is seized in the pixel electrode 9 as much as possible. Here, in the case in which the capacitance value of the storage capacitor 70 is low, since the time for sustaining the image signal is short, the quality of the display image is not much improved. Meanwhile, in the case in which the capacitance value of the storage capacitor 70 is high, since the image signal can be sustained for a long time, the improvement in the quality of the display image is expected, but a supply circuit or wiring for the image signal becomes bigger. For this reason, the capacitance value of the storage capacitor 70 is adjusted to a desired value in the actual liquid crystal apparatus.

On the capacitor separation film 80, the pixel electrode 9 is formed. As shown in FIG. 10, the pixel electrode 9 is formed in an island shape for every pixel which is divided in the matrix shape by the data lines 6 and the scanning lines 11. In this instance, although not shown herein, on the pixel electrode 9, an arrangement film 16 is formed to define an orientation state of liquid crystal molecules contained in the liquid crystal layer 50 (see FIG. 2).

Since each of the storage capacitors 70 includes the transparent capacitor electrode 71, the dielectric film 72 and the pixel electrode 9, the opening region is not narrowed, and the opening ratio which is a ratio of the opening region occupying the pixel is not lowered. Further, according to the storage capacitor 70, since the storage capacitor 70 may be formed in the opening region, it is able to increase the capacitance value thereof as compared with the case in which the storage capacitor is formed only in the non-opening region.

As described above, according to the liquid crystal device of the second embodiment, the capacitance value of the storage capacitor 70 is increased, and the size of the opening region is enlarged, thereby enhancing the display performance of the liquid crystal device 1, similar to the first embodiment.

2: Electronic Apparatus

Figure 12:
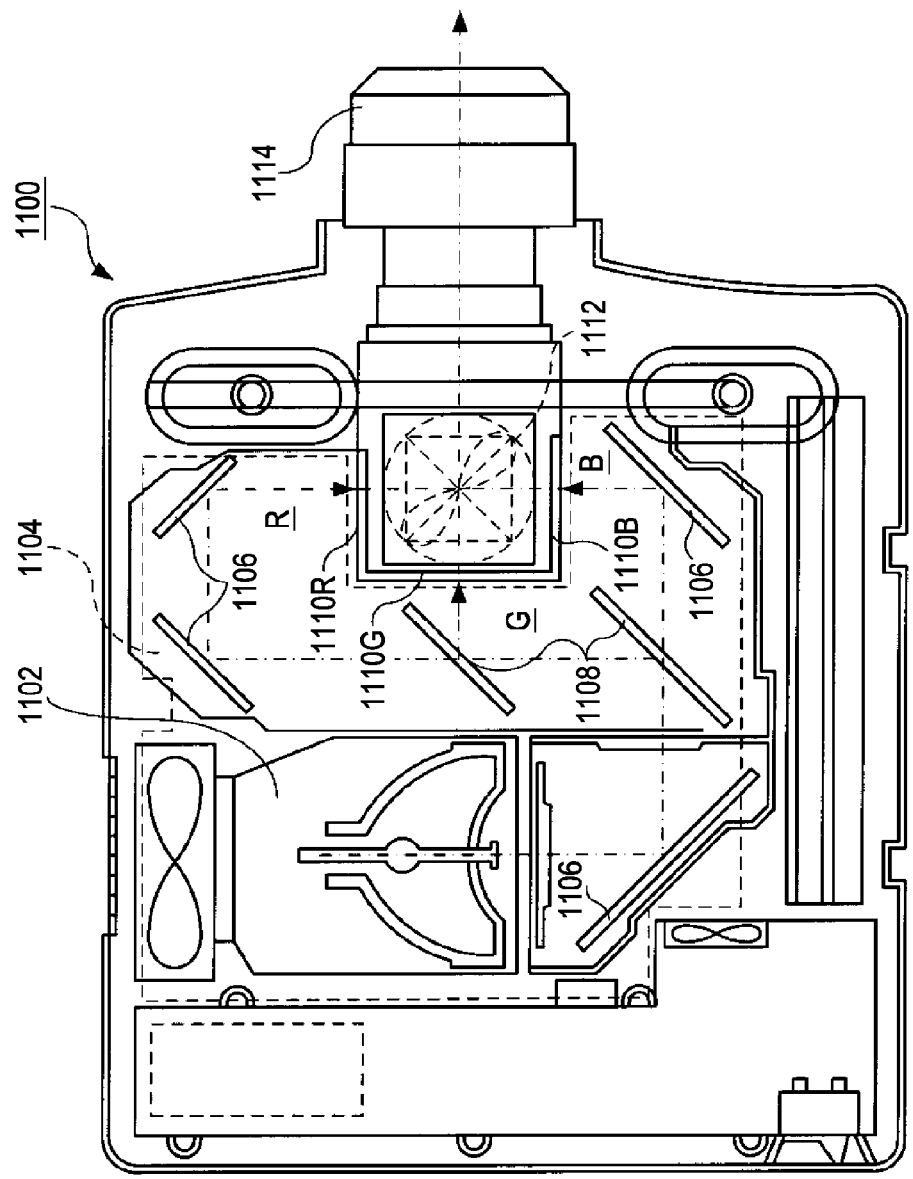
FIG. 12 is a plan view showing the configuration of a projector which is an example of an electronic device to which an electro-optical device according to the embodiment is applied.

Next, an example, in which the liquid crystal device described above is applied to a projector which is an example of the electronic apparatus, as a light valve will be described with reference to FIG. 12. FIG. 12 is a plan view showing an example of the configuration of the projector.

Referring to FIG. 12, inside a projector 1100, a lamp unit 1102 having a white light source, such as a halogen lamp, is provided. Light emitted from the lamp unit 1102 is separated into components of the three primary colors of RGB by four mirrors 1106 and two dichroic mirrors 1108 disposed in a light guide 1104, and the R, B, and G components enter liquid crystal panels 1110R, 1110B, and 1110G corresponding to each primary color, which serve as light valves, respectively.

The configurations of the liquid crystal panels 1110R, 1110B, and 1110G are equal to the liquid crystal device described above, and are driven respectively by primary-color signals of R, B, and G supplied from an image-signal processing circuit. Light components that have been modulated by these liquid crystal panels 1110R, 1110B, and 1110G enter a dichroic prism 1112 from three directions. The dichroic prism 1112 causes the R and B light components to refract by an angle of 90 degrees while causing the G light component to go straight. Thus, by combining images of the respective colors, a color image is projected onto a screen or the like via a projection lens 1114.

Considering the respective images displayed by the liquid crystal panels 1110R, 1110B, and 1110G, the image displayed by the liquid crystal panel 1110G has to be flipped left-for-right with respect to the images displayed by the liquid crystal panels 1110R and 1110B.

Since the liquid crystal panels 1110R, 1110B, and 1110G receive light components of the primary colors of R, B, and G via the dichroic mirrors 1108, respectively, color filters need not be provided.

Without limitation to the electronic apparatus described with reference to FIG. 12, the liquid crystal device can be used in various other electronic apparatuses, such as mobile personal computers, cellular phones, liquid crystal television sets, view-finders or monitor-direct-viewing video tape recorders, car navigation sets, pagers, electronic notebooks, electronic calculators, word processors, workstations, video phones, point-of-sale (POS) terminals, or apparatuses having touch panels.

In addition, without limitation to the liquid crystal device described in each embodiment, the invention can be applied to liquid crystal on silicon (LCOS), a plasma display panel (PDP), a field emission display or surface-conductive electron emitter display (FED or SED), an organic EL display, a digital micromirror device (DMD), an electrophoresis device, and so forth.

The invention is not limited to the embodiments described above, and various modifications can be made without departing from the gist or spirit of the invention as understood from the claims and the specification as a whole. Electro-optical devices involving such modifications and electronic apparatuses including such electro-optical devices also fall within the scope of the invention.

The entire disclosure of Japanese Patent Application Nos: 2009-000277, filed Jan. 5, 2009, 2009-259898, filed Nov. 13, 2009 are expressly incorporated by reference herein.

What is claimed is:

1. An electro-optical device comprising:
a substrate having a plurality of pixels each of which has an opening region, the opening region being a region through which light penetrates;
a transistor element formed above the substrate having an input terminal and an output terminal;
a light shielding film formed above the transistor element to overlap the transistor element;
a first relay layer of an island shape formed on the same layer as the light shielding film;
a transparent conductive film formed above the light shielding film and formed at least in the opening region and having a first aperture portion which is formed between two adjacent pixels of the plurality of pixels;
a second relay layer of an island shape formed on the same layer as the transparent conductive film being placed inside the first aperture portion when seen in a plan view;
a dielectric film formed above the transparent conductive film in the opening region;
a transparent pixel electrode formed above the dielectric film in the opening region;

a third relay layer provided on a layer between the transistor element and the first relay layer being electrically connected to the output terminal of the transistor element and the first relay layer, wherein, the transistor element includes a semiconductor layer, the semiconductor layer is extended along a first direction, the light shielding film is electrically connected to the input terminal of the transistor element, the first relay layer is electrically connected to the output terminal of the transistor element and the second relay layer, the second relay layer is electrically connected to the first relay layer and the transparent pixel electrode, the transparent pixel electrode constitutes a storage capacitor together with the transparent conductive film and the dielectric film, the second relay layer has a transparent connection portion which is extended along a thickness direction of the substrate in the first aperture portion, and which is electrically connected to the output terminal of the transistor element and the transparent pixel electrode, the second relay layer is transparent, the second relay layer and the transparent pixel electrode are connected in the opening region, the third relay layer has a body portion extending in a second direction intersecting the first direction, and a protrusion portion protruding from the body portion in the first direction, and wherein the third relay layer is disposed to overlap a portion of a channel portion of the transistor element and output terminal of the transistor element, the third relay layer has a light shielding connection portion which is extended along a thickness direction of the substrate and which is electrically connected to the output terminal of the transistor element, and the light shielding connection portion is disposed above the output terminal of the transistor element.

2. The electro-optical device according to claim 1, wherein the dielectric film is made of alumina.

3. An electronic apparatus comprising the electro-optical device according to claim 1.

4. The electro-optical device according to claim 1, wherein, the first relay layer having a first width along the first direction, the second relay layer having a second width along the first direction, and the first width is smaller than the second width.

5. An electro-optical device comprising:

a substrate having a plurality of pixels each of which has an opening region, the opening region being a region through which light penetrates;

a transistor element formed above the substrate having an input terminal and an output terminal;

a light shielding film formed above the transistor element to overlap the transistor element;

a first relay layer of an island shape formed on the same layer as the light shielding film;

a transparent conductive film formed above the light shielding film and formed at least in the opening region and having a first aperture portion which is formed between two adjacent pixels of the plurality of pixels;

a second relay layer of an island shape formed on the same layer as the transparent conductive film being placed inside the first aperture portion when seen in a plan view;

a dielectric film formed above the transparent conductive film in the opening region;

a transparent pixel electrode formed above the dielectric film in the opening region;

a capacitor separation film placed between the transparent conductive film and the pixel electrode; and the capacitor separation film separating a storage capacitor formed below the two adjacent pixels, wherein, the transistor element includes a semiconductor layer, the semiconductor layer is extended along a first direction, the light shielding film is electrically connected to the input terminal of the transistor element, the first relay layer is electrically connected to the output terminal of the transistor element and the second relay layer, the second relay layer is electrically connected to the first relay layer and the transparent pixel electrode, the transparent pixel electrode constitutes the storage capacitor together with the transparent conductive film and the dielectric film, the second relay layer has a transparent connection portion which is extended along a thickness direction of the substrate in the first aperture portion, and which is electrically connected to the output terminal of the transistor element and the transparent pixel electrode, the second relay layer is transparent, the second relay layer and the transparent pixel electrode are connected in the opening region, the capacitor separation film has a second aperture portion which is formed in an opening region other than the first aperture portion, and the storage capacitor has a shape corresponding with the second aperture portion.

6. An electro-optical device comprising:

a substrate has a plurality of pixels each of which has an opening region, the opening region being a region through which light penetrates;

a transistor element formed above the substrate having an input terminal and an output terminal;

a light shielding film formed above the transistor element to overlap the transistor element;

a first relay layer of an island shape formed on the same layer as the light shielding film;

a transparent conductive film formed above the light shielding film and formed at least in the opening and having a first aperture portion which is formed between two adjacent pixels of the plurality of pixels;

a second relay layer of an island shape formed on the same layer as the transparent conductive film being placed inside the first aperture portion when seen in a plan view;

a dielectric film formed above the transparent conductive film in the opening region;

a transparent pixel electrode formed above the dielectric film in the opening region; and a capacitor separation film placed between the transparent conductive film and the pixel electrode, wherein, the transistor element includes a semiconductor layer, the semiconductor layer is extended along a first direction, the light shielding film is electronically connected to the input terminal of the transistor element, the first relay layer is electrically connected to the output terminal of the transistor element and the second relay layer, the second relay layer is electrically connected to the first relay layer and the transparent pixel electrode, and the transparent pixel electrode constitutes a storage capacitor together with the transparent conductive film and dielectric film, the second relay layer has a transparent connection portion which is extended along a thickness direction of the substrate in the first aperture portion, and which is electrically connected to the output terminal of the transistor element and the transparent pixel electrode, and the capacitor separation film separating the storage capacitor formed below the two adjacent pixels.

* * * * *